United States Patent
Greene et al.

(10) Patent No.: US 9,093,275 B2
(45) Date of Patent: Jul. 28, 2015

(54) MULTI-HEIGHT MULTI-COMPOSITION SEMICONDUCTOR FINS

(71) Applicant: International Business Machines Corporation, Armonk, NY (US)

(72) Inventors: Brian J. Greene, Wappingers Falls, NY (US); Augustin J. Hong, White Plains, NY (US); Byeong Y. Kim, Lagrangeville, NY (US); Dan M. Mocuta, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 14/059,797

(22) Filed: Oct. 22, 2013

(65) Prior Publication Data

US 2015/0108616 A1 Apr. 23, 2015

(51) Int. Cl.
| | |
|---|---|
| *H01L 21/027* | (2006.01) |
| *H01L 21/02* | (2006.01) |
| *H01L 29/78* | (2006.01) |
| *H01L 29/786* | (2006.01) |
| *H01L 21/18* | (2006.01) |
| *H01L 29/165* | (2006.01) |

(52) U.S. Cl.
CPC ...... *H01L 21/02636* (2013.01); *H01L 21/0262* (2013.01); *H01L 21/02433* (2013.01); *H01L 21/02532* (2013.01); *H01L 21/182* (2013.01); *H01L 29/165* (2013.01); *H01L 29/785* (2013.01); *H01L 29/78603* (2013.01)

(58) Field of Classification Search
CPC .................. H01L 21/02433; H01L 21/02636; H01L 21/02532; H01L 21/0262
See application file for complete search history.

(56) References Cited

U.S. PATENT DOCUMENTS

| | | |
|---|---|---|
| 6,909,147 B2 | 6/2005 | Aller et al. |
| 7,560,785 B2 | 7/2009 | Yu et al. |
| 8,476,137 B1 * | 7/2013 | LiCausi et al. ............... 438/270 |

(Continued)

OTHER PUBLICATIONS

Liow, T.Y. et al., "Investigation of silicon—germanium fins fabricated using germanium condensation on verticle compliant structures" Applied Physics Letters (Dec. 2005) vol. 87, issue 26.

(Continued)

*Primary Examiner* — Wael Fahmy
*Assistant Examiner* — Sarah Salerno
(74) *Attorney, Agent, or Firm* — Scully, Scott, Murphy & Presser, P.C.; H. Daniel Schnurmann

(57) ABSTRACT

A dielectric material layer is formed on a semiconductor-on-insulator (SOI) substrate including a top semiconductor layer containing a first semiconductor material. An opening is formed within the dielectric material layer, and a trench is formed in the top semiconductor layer within the area of the opening by an etch. A second semiconductor material is deposited to a height above the top surface of the top semiconductor layer employing a selective epitaxy process. Another dielectric material layer can be deposited, and another trench can be formed in the top semiconductor layer. Another semiconductor material can be deposited to a different height employing another selective epitaxy process. The various semiconductor material portions can be patterned to form semiconductor fins having different heights and/or different compositions.

15 Claims, 7 Drawing Sheets

(56) References Cited

U.S. PATENT DOCUMENTS

| | | | |
|---|---|---|---|
| 2008/0122013 A1* | 5/2008 | Schepis et al. | 257/401 |
| 2009/0159972 A1* | 6/2009 | Jakschik et al. | 257/350 |
| 2013/0082329 A1 | 4/2013 | Chen et al. | |
| 2014/0097518 A1* | 4/2014 | Cheng et al. | 257/618 |

OTHER PUBLICATIONS

Chen, C.W. et al., "Germanium N and P Multifin Field-Effect Transistors With High-Performance Germanium (Ge) p+/n and n+/p Heterojunctions Formed on Si Substrate" IEEE Transactions on Electron Devices (Apr. 2013) pp. 1334-1341, vol. 60, No. 4.

* cited by examiner

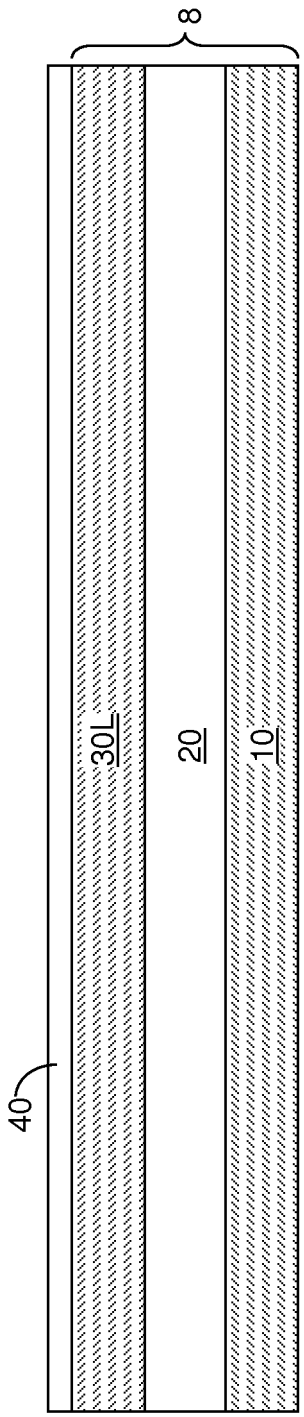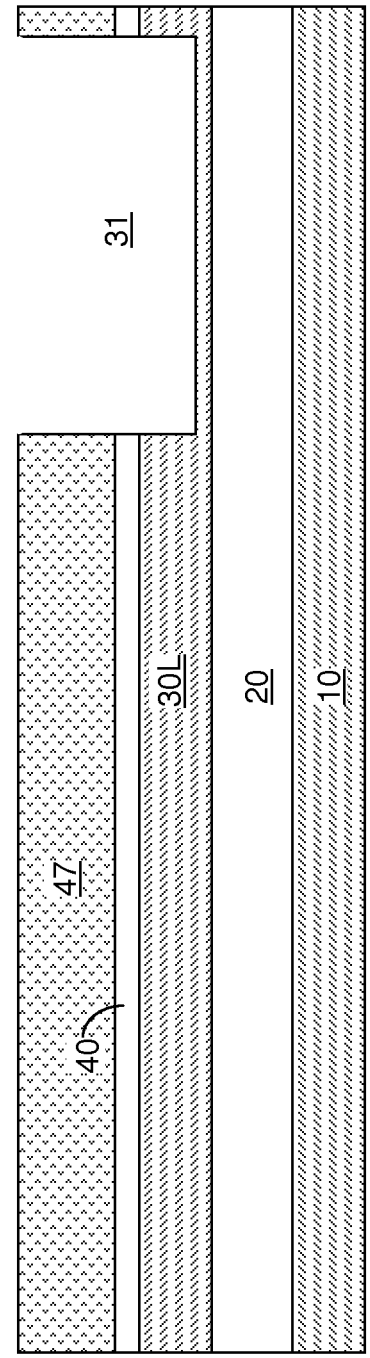

MULTI-HEIGHT MULTI-COMPOSITION SEMICONDUCTOR FINS

BACKGROUND

The present disclosure relates to semiconductor structures, and particularly to semiconductor fin structures including multiple heights and/or multiple compositions and a method of manufacturing the same.

A finFET is a field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

In conventional semiconductor fin devices, the height of semiconductor fins is fixed, and the output of the semiconductor fin devices is controlled by the number of semiconductor fins within each semiconductor fin device. For example, the on-current of a fin field effect transistor is digitally changed by changing the total number of semiconductor fins within the fin field effect transistor, while the semiconductor fins have the same height. As a result, the output of conventional semiconductor fin devices on a same substrate is quantized, and incremental adjustment of the output by an amount less than the output from a single semiconductor fin is difficult to achieve.

SUMMARY

A dielectric material layer is formed on a semiconductor-on-insulator (SOI) substrate including a top semiconductor layer containing a first semiconductor material. An opening is formed within the dielectric material layer, and a trench is formed in the top semiconductor layer within the area of the opening by an etch. A second semiconductor material is deposited to a height above the top surface of the top semiconductor layer employing a selective epitaxy process. Another dielectric material layer can be deposited, and another trench can be formed in the top semiconductor layer. Another semiconductor material can be deposited to a different height employing another selective epitaxy process. The various semiconductor material portions can be patterned to form semiconductor fins having different heights and/or different compositions. Optionally, an anneal may be performed to homogenize the composition of semiconductor materials across the deposited semiconductor materials and remaining portions of the top semiconductor layer.

According to an aspect of the present disclosure, a method of forming a semiconductor structure is provided. A first dielectric material layer is formed on a top surface of a semiconductor layer of a semiconductor-on-insulator (SOI) substrate. The semiconductor layer is a first single crystalline semiconductor material portion including a first single crystalline semiconductor material. A first trench is formed through the first dielectric material layer and an upper region of the semiconductor layer. A second single crystalline semiconductor material portion is grown from surfaces of the semiconductor layer within the first trench in a first selective epitaxy process. The second single crystalline semiconductor material portion includes a second single crystalline semiconductor material and fills the first trench. A second dielectric material layer is formed on the top surface of the first dielectric material layer and a top surface of the second single crystalline semiconductor material portion. A second trench is formed through the second dielectric material layer, the first dielectric material layer, and another upper region of the semiconductor layer. A third single crystalline semiconductor material portion is grown from surfaces of the semiconductor layer within the second trench by a second selective epitaxy process. The third single crystalline semiconductor material portion includes a third single crystalline semiconductor material and fills the second trench.

According to another aspect of the present disclosure, a semiconductor structure includes an insulator layer, a first-type semiconductor fin including a first single crystalline semiconductor material and located on a planar top surface of the insulator layer, a second-type semiconductor fin including a vertical stack of a portion of the first single crystalline semiconductor material and a portion of a second single crystalline semiconductor material that is different from the first single crystalline semiconductor material, and a third-type semiconductor fin including a vertical stack of another portion of the first single crystalline semiconductor material and a portion of a third single-crystalline semiconductor material that is different from the first single crystalline semiconductor material.

BRIEF DESCRIPTION OF SEVERAL VIEWS OF THE DRAWINGS

FIG. 1 is a vertical cross-sectional view of an exemplary semiconductor structure after formation of a first dielectric material layer on a semiconductor-on-insulator (SOI) substrate according to an embodiment of the present disclosure.

FIG. 2 is a vertical cross-sectional view of the exemplary semiconductor structure after formation of a first trench in a top semiconductor layer of the SOI substrate according to an embodiment of the present disclosure.

DETAILED DESCRIPTION

Figure 3:
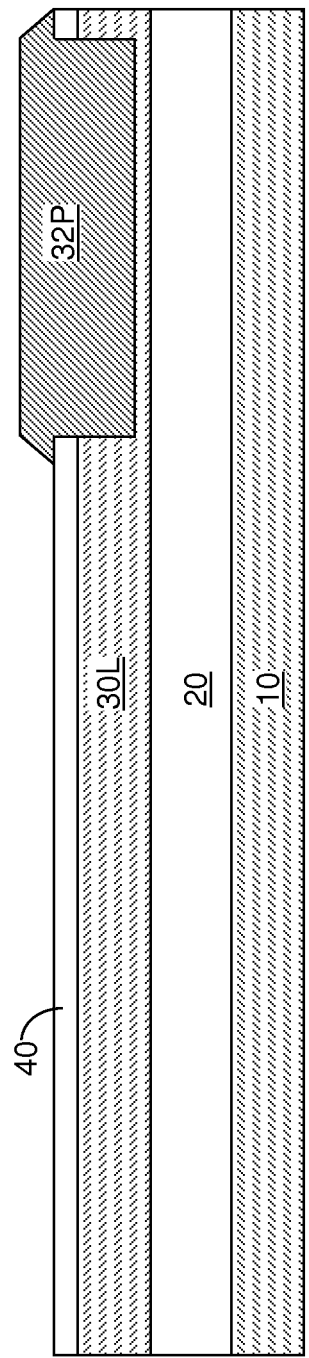
FIG. 3 is a vertical cross-sectional view of the exemplary semiconductor structure after a first selective epitaxy process that forms a first epitaxial semiconductor region according to an embodiment of the present disclosure.

As stated above, the present disclosure relates to semiconductor fin structures including multiple heights and/or multiple compositions and a method of manufacturing the same. Aspects of the present disclosure are now described in detail with accompanying figures. It is noted that like reference numerals refer to like elements across different embodiments. The drawings are not necessarily drawn to scale.

Referring to FIG. 1, an exemplary semiconductor structure according to an embodiment of the present disclosure includes a semiconductor-on-insulator (SOI) substrate 10, which contains a stack, from bottom to top, of a handle substrate 10, an insulator layer 20, and a semiconductor layer 30L. The handle substrate 10 can include a semiconductor material, a conductive material, a dielectric material, or a combination thereof. The handle substrate 10 can be sufficiently thick to provide mechanical support for the insulator layer 20 and the semiconductor layer 30L. For example, the handle substrate 10 can have a thickness in a range from 30 microns to 1 mm, although lesser and greater thicknesses can also be employed.

The insulator layer 20 includes a dielectric material such as silicon oxide, silicon nitride, sapphire, or a combination thereof. The thickness of the insulator layer 20 can be from 10 nm to 1 micron, although lesser and greater thicknesses can also be employed.

The semiconductor layer 30L includes a first single crystalline semiconductor material, and as such, is a first single crystalline semiconductor material portion. In one embodiment, the first single crystalline semiconductor material is single crystalline silicon. The thickness of the semiconductor layer 30L can be in a range from 10 nm to 1 micron, although lesser and greater thicknesses can also be employed.

The top semiconductor layer 30L may include at least one intrinsic region and/or at least one doped semiconductor region doped with electrical dopants. As used herein, electrical dopants refer to p-type dopants and n-type dopants as known in the art. Multiple doped regions of various types may be formed within the top semiconductor layer 30L.

A first dielectric material layer 40 is formed on the top surface of the semiconductor layer 30L. The first dielectric material layer 40 includes an amorphous dielectric material, which can be silicon oxide, silicon nitride, a dielectric metal oxide, or a combination thereof. In one embodiment, the first dielectric material layer 40 can be formed by thermal oxidation and/or thermal nitridation of a surface portion of the semiconductor layer 30L. In another embodiment, the first dielectric material layer 40 can be formed by deposition of a dielectric material by chemical vapor deposition (CVD) or atomic layer deposition (ALD). The thickness of the first dielectric material layer 40 can be in a range from 1 nm to 100 nm, although lesser and greater thicknesses can also be employed. In one embodiment, the thickness of the first dielectric material layer 40 can be in a range from 1 nm to 5 nm. In another embodiment, the thickness of the first dielectric material layer 40 can be in a range from 5 nm to 20 nm.

Referring to FIG. 2, a first photoresist layer 47 is applied over first dielectric material layer 40, and is lithographically exposed and developed to form an opening within the first photoresist layer 47. A first trench 31 is formed through the first dielectric material layer 40 and an upper region of the semiconductor layer 30L by an etch that employs the patterned first photoresist layer 47 as an etch mask layer. The etch can be an anisotropic etch such as a reactive ion etch. In this case, the sidewalls of the first trench 31 can be vertically coincident with sidewalls of the patterned first photoresist layer 47.

The duration of the etch is selected such that the bottom surface of the first trench 31 after the etch is located between a horizontal plane including the top surface of the semiconductor layer 30L and another horizontal plane including the bottom surface of the semiconductor layer 30L. Single crystalline surfaces of the semiconductor layer 30L are physically exposed at the bottom surface and the sidewalls of the first trench 31. In one embodiment, the vertical dimension of the first trench 31 between the bottom surface of the first trench and the horizontal plane including the interface between the semiconductor layer 30L and the first dielectric layer 40 can be greater than the thickness of the first dielectric material layer 40. The first photoresist layer 47 is subsequently removed, for example, by ashing.

Referring to FIG. 3, a first selective epitaxy process is performed on the exemplary semiconductor structure to form a first epitaxial semiconductor region that fills the first trench 31 (See FIG. 2). The first epitaxial semiconductor portion includes a second single crystalline semiconductor material, and thus, is referred to as a second single crystalline semiconductor material portion 32P. The second single crystalline semiconductor material portion 32P is grown from surfaces of the semiconductor layer 30L within the first trench 31 in the first selective epitaxy process, and completely fills the first trench 31.

The duration of the first selective epitaxy process is selected such that a planar top surface of the second single crystalline semiconductor material portion 32P is formed above the horizontal plane including the top surface of the first dielectric material layer 40.

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate of the deposited semiconductor material is the difference between the deposition rate of the second single crystalline semiconductor material due to the reactant gas less the etch rate of the semiconductor material due to the etchant gas. The selective epitaxy process does not deposit any semiconductor material on amorphous surfaces such as the surfaces of the first dielectric material layer 40 because any semiconductor material that nucleates on the amorphous surfaces is etched by the etchant gas before a contiguous layer of a deposited semiconductor material can be formed on the dielectric surfaces. Deposition of the second single crystalline semiconductor material proceeds on the single crystalline surfaces of the semiconductor layer 30L.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

In one embodiment, the second single crystalline semiconductor material portion 32P can be formed with in-situ doping so that the second single crystalline semiconductor material is doped with electrical dopants during the selective epitaxy. Alternately, the second single crystalline semiconductor material portion 32P can be formed without doping, i.e., as an intrinsic semiconductor material portion.

In one embodiment, the second single crystalline semiconductor material in the second single crystalline semiconductor material portion 32P can be a single crystalline silicon-containing alloy, which is herein referred to as a first single crystalline silicon-containing alloy. As used herein, a silicon-containing alloy refers to a semiconductor alloy including at least silicon as a component. In one embodiment, the silicon-containing alloy can be a single crystalline silicon-germanium alloy, a single crystalline silicon-carbon alloy, or a single crystalline silicon-germanium-carbon alloy.

In one embodiment, physically exposed surfaces of the second single crystalline semiconductor material portion 32P can be faceted crystallographic surfaces. In one embodiment, the physically exposed surfaces of the second single crystalline semiconductor material portion 32P can include a crystallographic facet that is parallel to the interface between the semiconductor layer 30L and the first dielectric material layer 40 and peripheral faceted surfaces that are at non-zero angles with respect to the interface between the semiconductor layer 30L and the first dielectric material layer 40 and in physical contact with the top surfaces of the first dielectric material layer 40. A contiguous peripheral portion of the second single crystalline semiconductor material portion 32P can overlie a peripheral portion of the top surface of the first dielectric material layer 40 that laterally surrounds the first trench 31 (See FIG. 3). Thus, a bottom surface of the second single crystalline semiconductor material portion 32P can contiguously contact the top surface of the first dielectric material layer 40 such that the shape of the contact area between the second single crystalline semiconductor material portion 32P and the top surface of the first dielectric material layer 40 is topologically homeomorphic to a ring-shaped two-dimensional surface, i.e., can be continuously stretched to a two-dimensional surface with a single inner periphery and a single outer periphery without forming or destroying a singularity during mathematical mapping.

Figure 4:
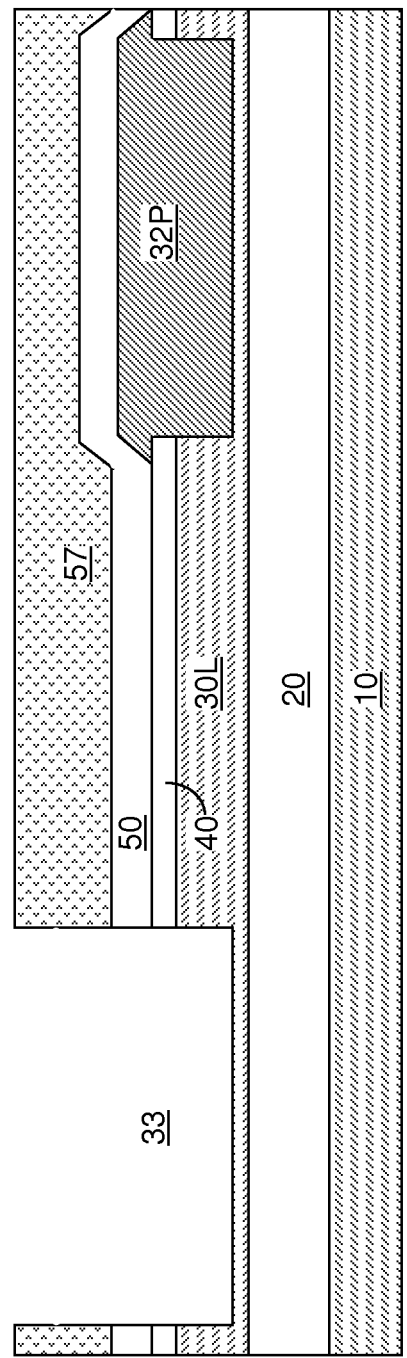
FIG. 4 is a vertical cross-sectional view of the exemplary semiconductor structure after formation of a second trench in the top semiconductor layer of the SOI substrate according to an embodiment of the present disclosure.

Referring to FIG. 4, a second dielectric material layer 50 is formed on the top surface of the first dielectric material layer 40 and the second single crystalline semiconductor material portion 32P. The second dielectric material layer 50 includes an amorphous dielectric material, which can be silicon oxide, silicon nitride, a dielectric metal oxide, or a combination thereof. The composition of the second dielectric material layer 50 can be the same as, or different from, the composition of the first dielectric material layer 40. The second dielectric material layer 50 can be formed by deposition of a dielectric material by chemical vapor deposition (CVD) or atomic layer deposition (ALD). The thickness of the second dielectric material layer 50 can be in a range from 1 nm to 100 nm, although lesser and greater thicknesses can also be employed. In one embodiment, the thickness of the second dielectric material layer 50 can be in a range from 1 nm to 5 nm. In another embodiment, the thickness of the second dielectric material layer 50 can be in a range from 5 nm to 20 nm.

A second photoresist layer 57 is applied over second dielectric layer 50, and is lithographically exposed and developed to form an opening within the second photoresist layer 57. A second trench 33 is formed through the second dielectric material layer 50, the first dielectric material layer 40, and an upper region of the semiconductor layer 30L by an etch that employs the patterned second photoresist layer 57 as an etch mask layer. The etch can be an anisotropic etch such as a reactive ion etch. In this case, the sidewalls of the second trench 33 can be vertically coincident with sidewalls of the patterned second photoresist layer 57.

The duration of the etch is selected such that the bottom surface of the second trench 33 after the etch is located between a horizontal plane including the top surface of the semiconductor layer 30L and another horizontal plane including the bottom surface of the semiconductor layer 30L. Single crystalline surfaces of the semiconductor layer 30L are physically exposed at the bottom surface and the sidewalls of the second trench 33. In one embodiment, the vertical distance between the bottom surface of the second trench and the horizontal plane including the interface between the first dielectric layer 40 and the second dielectric layer 50 can be greater than the sum of the thicknesses of the second dielectric material layer 50 and the first dielectric material layer 40. The second photoresist layer 57 is subsequently removed, for example, by ashing.

Figure 5:
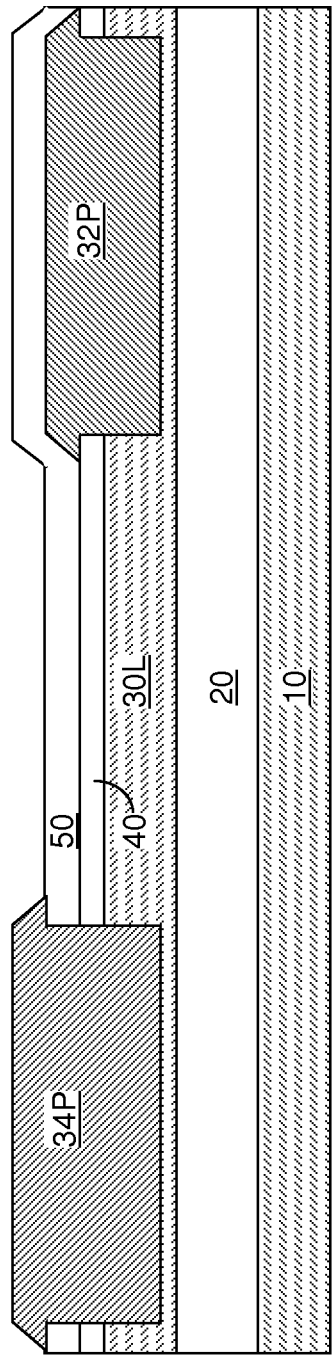
FIG. 5 is a vertical cross-sectional view of the exemplary semiconductor structure after a second selective epitaxy process that forms a second epitaxial semiconductor region according to an embodiment of the present disclosure.

Referring to FIG. 5, a second selective epitaxy process is performed on the exemplary semiconductor structure to form a second epitaxial semiconductor region that fills the second trench 33 (See FIG. 4). The second epitaxial semiconductor portion includes a third single crystalline semiconductor material, and thus, is referred to as a third single crystalline semiconductor material portion 34P. The third single crystalline semiconductor material portion 34P is grown from surfaces of the semiconductor layer 10 within the second trench 33 in the second selective epitaxy process, and completely fills the second trench 33.

The duration of the second selective epitaxy process is selected such that a planar top surface of the third single crystalline semiconductor material portion 34P is formed above a horizontal plane including a top surface of the second dielectric material layer 50 that is in physical contact with a bottom surface of the third single crystalline semiconductor material portion 34P.

In one embodiment, the third single crystalline semiconductor material portion 34P can be formed with in-situ doping so that the third single crystalline semiconductor material is doped with electrical dopants during the selective epitaxy. Alternately, the third single crystalline semiconductor material portion 34P can be formed without doping, i.e., as an intrinsic semiconductor material portion.

In one embodiment, the third single crystalline semiconductor material in the third single crystalline semiconductor material portion 34P can be a single crystalline silicon-containing alloy, which is herein referred to as a second single crystalline silicon-containing alloy. In one embodiment, the silicon-containing alloy can be a single crystalline silicon-germanium alloy, a single crystalline silicon-carbon alloy, or a single crystalline silicon-germanium-carbon alloy.

The composition of the second single crystalline silicon-containing alloy can be the same as, or can be different from, the composition of the first single crystalline silicon-containing alloy. In one embodiment, the first and second single crystalline silicon-containing alloys can be single crystalline silicon-germanium alloys having different atomic concentrations of germanium, single crystalline silicon-carbon alloys having different atomic concentrations of carbon, or single crystalline silicon-germanium-carbon alloys having different atomic concentrations of germanium and/or different atomic concentrations of carbon. Alternately, one of the first and second single crystalline silicon-containing alloys can include a semiconductor element, i.e., germanium or carbon, that is not included in the other of the first and second single crystalline silicon-containing alloys.

In one embodiment, physically exposed surfaces of the third single crystalline semiconductor material portion 34P can be faceted crystallographic surfaces. In one embodiment, the physically exposed surfaces of the third single crystalline semiconductor material portion 34P can include a crystallographic facet that is parallel to the interface between the semiconductor layer 30L and the first dielectric material layer 40 and peripheral faceted surfaces that are at non-zero angles with respect to the interface between the semiconductor layer 30L and the first dielectric material layer 40 and in physical contact with the top surfaces of the second dielectric material layer 50. A contiguous peripheral portion of the third single crystalline semiconductor material portion 34P can overlie a peripheral portion of the top surface of the second dielectric material layer 50 that laterally surrounds the second trench 33 (See FIG. 4). Thus, a bottom surface of the third single crystalline semiconductor material portion 34P can contiguously contact the top surface of the second dielectric material layer 50 such that the shape of the contact area between the third single crystalline semiconductor material portion 34P and the top surface of the second dielectric material layer 50 is topologically homeomorphic to a ring-shaped two-dimensional surface.

In one embodiment, the top surface (which can be a crystallographic facet) of the third single crystalline semiconductor material portion 34P can be located within a horizontal plane that is located above the horizontal plane including a top surface of the second single crystalline semiconductor material portion 32P. In this case, the thickness of the third single crystalline semiconductor material portion 34P can be greater than the thickness of the second single crystalline semiconductor material portion 32P.

Figure 6:
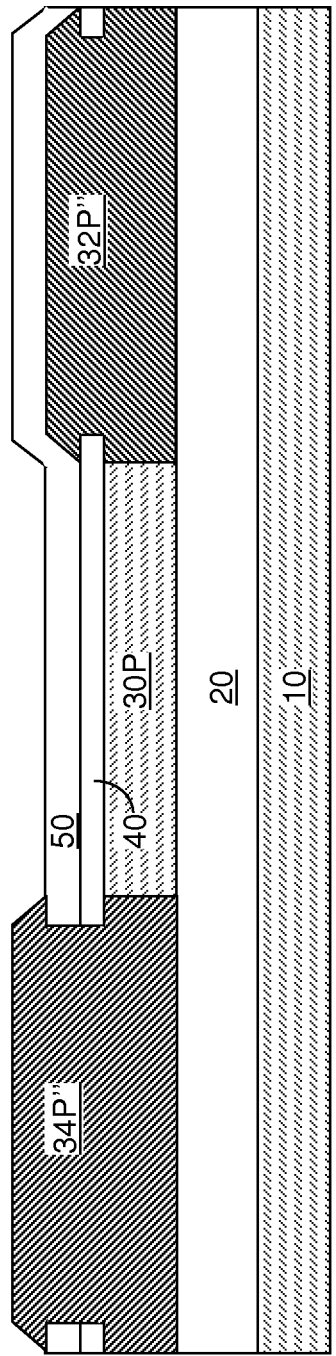
FIG. 6 is a vertical cross-sectional view of the exemplary semiconductor structure after annealing the epitaxial semiconductor regions and the top semiconductor layer to provide homogenized semiconductor regions according to an embodiment of the present disclosure.

Referring to FIG. 6, the exemplary semiconductor structure can be optionally annealed to induce interdiffusion between the first single crystalline semiconductor material portion of the semiconductor layer 10 and the second single crystalline semiconductor material portion 32P, and between the first single crystalline semiconductor material portion of the semiconductor layer 10 and the third single crystalline semiconductor material portion 34P. The remaining portion of the semiconductor layer 30L is herein referred to as a first single crystalline semiconductor material portion 30P. Specifically, semiconductor elements within the first, second, and third single crystalline semiconductor material portions (10, 32P, 34P) diffuse across the interface thereamongst, and forms alloys thereamongst. The temperature of the anneal can be in a range from 600 degrees Celsius to 1,200 degrees Celsius. The duration of the anneal can be in a range from 1 second to 24 hours.

In one embodiment, the temperature and duration of the anneal can be selected such that the annealed second and third single crystalline semiconductor material portions (32P, 34P) include homogeneous semiconductor alloy regions having a uniform composition. In one embodiment, an annealed second single crystalline semiconductor material portion 32P' can include a homogenized semiconductor region having a homogenous composition between the interface with the insulator layer 20 and the top surface of the annealed second single crystalline semiconductor material portion 32P'. Likewise, an annealed third single crystalline semiconductor material portion 34P' can include a homogenized semiconductor region having a homogenous composition between the interface with the insulator layer 20 and the top surface of the annealed third single crystalline semiconductor material portion 34P'. The annealed second single crystalline semiconductor material portion 32P' is a first single crystalline alloy region including an alloy of the first single crystalline semiconductor material and the second single crystalline semiconductor material. The annealed third single crystalline semiconductor material portion 34P' is a second single crystalline alloy region including an alloy of the first single crystalline semiconductor material and the third single crystalline semiconductor material.

In one embodiment, the first single crystalline semiconductor material can be single crystalline silicon, the second single crystalline semiconductor material can be a first single crystalline silicon-containing alloy, and the third single crystalline semiconductor material can be a second single crystalline silicon-containing alloy having a different composition from the first single crystalline silicon-containing alloy. In one embodiment, each of the first single crystalline silicon-containing alloy and the second single crystalline silicon-containing alloy can be independently selected from a single crystalline silicon-germanium alloy, a single crystalline silicon-carbon alloy, and a single crystalline silicon-germanium-carbon alloy.

Figure 7:
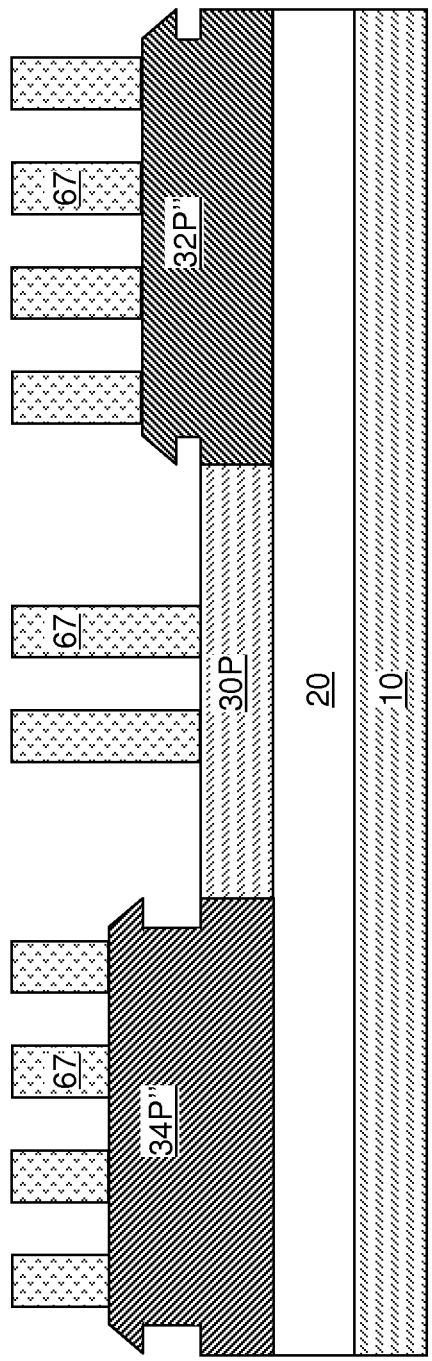
FIG. 7 is a vertical cross-sectional view of the exemplary semiconductor structure after application and patterning of a photoresist layer according to an embodiment of the present disclosure.

Referring to FIG. 7, the second and first dielectric material layers (50, 40) are removed selective to the semiconductor materials of the first single crystalline semiconductor material portion 30P and the annealed second and third single crystalline semiconductor material portions (32P', 34P'). If the anneal is not performed, the second and first dielectric material layers (50, 40) are removed selective to the semiconductor materials of the first single crystalline semiconductor material portion 30P and the second and third single crystalline semiconductor material portions (32P, 34P). In one embodiment, a wet etch can be employed to remove the second and first dielectric material layers (50, 40). For example, if the second and first dielectric material layers (50, 40) include silicon oxide, a wet etch employing a hydrofluoric acid can be employed to remove the second and first dielectric material layers (50, 40) selective to the semiconductor materials.

Subsequently, a photoresist layer 67 is applied over the first single crystalline semiconductor material portion 30P and the annealed second and third single crystalline semiconductor material portions (32P', 34P') (or the second and third single crystalline semiconductor material portions (32P, 34P) if the processing steps of FIG. 6 is skipped), and is lithographically patterned in shapes representing horizontal cross-sectional shapes of semiconductor fins to be subsequently formed. Alternatively, a more complex scheme employing a hard mask layer and/or another patterning material layer can be employed instead of a simple photoresist patterning scheme to implement the concept of this disclosure.

Figure 8:
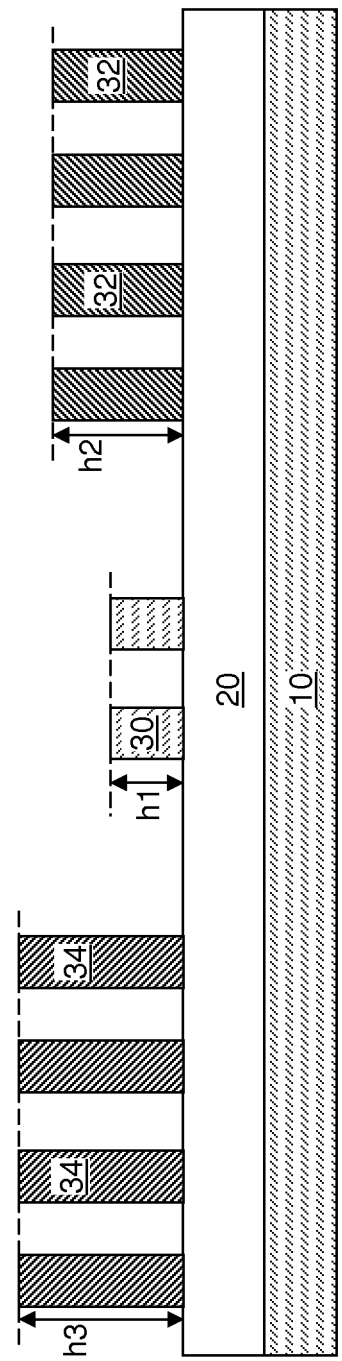
FIG. 8 is a vertical cross-sectional view of the exemplary semiconductor structure after formation of multiple types of semiconductor fins according to an embodiment of the present disclosure.

Referring to FIG. 8, multiple types of semiconductor fins (30, 32, 34) are formed by patterning the first single crystalline semiconductor material portion 30P and the annealed second and third single crystalline semiconductor material portions (32P', 34P') (or the second and third single crystalline semiconductor material portions (32P, 34P) if the processing steps of FIG. 6 is skipped). As used herein, a "semiconductor fin" refers to a semiconductor material portion having a parallel pair of sidewalls. A semiconductor fin can have a height that is greater than the width. Specifically, the pattern in the photoresist layer 67 is transferred into the first single crystalline semiconductor material portion 30P and the annealed second and third single crystalline semiconductor material portions (32P', 34P') by an anisotropic etch to replicate the pattern in the photoresist layer 67 within the first single crystalline semiconductor material portion 30P and the annealed second and third single crystalline semiconductor material portions (32P', 34P'). An anisotropic etch that employs the photoresist layer 67 as an etch mask can be employed.

The multiple types of semiconductor fins (30, 32, 34) include first-type semiconductor fins 30 including remaining portions of the first single crystalline semiconductor material of the first single crystalline semiconductor material portion 30P, second-type semiconductor fins 32 including the alloy of the first single crystalline semiconductor material and the second single crystalline semiconductor material as provided from the annealed second single crystalline semiconductor material portions 32P', and third-type semiconductor fins 34 including the alloy of the first single crystalline semiconductor material and the third single crystalline semiconductor material as provided from the annealed second single crystalline semiconductor material portions 34P'.

The second-type semiconductor fins 32 can have a homogenous composition throughout, and the third-type semiconductor fins 34 can have another homogenous composition throughout. In one embodiment, the first single crystalline semiconductor material is single crystalline silicon, the alloy of the first single crystalline semiconductor material and the second single crystalline semiconductor material is a first single crystalline silicon-containing alloy, and the alloy of the first single crystalline semiconductor material and the third single crystalline semiconductor material is a second single crystalline silicon-containing alloy having a different composition from the first single crystalline silicon-containing alloy. In one embodiment, each of the first single crystalline silicon-containing alloy and the second single crystalline silicon-containing alloy can be independently selected from a single crystalline silicon-germanium alloy, a single crystalline silicon-carbon alloy, and a single crystalline silicon-germanium-carbon alloy.

In one embodiment, the second type-semiconductor fins 32 and/or the third-type semiconductor fins 34 can have the same composition as the first-type semiconductor fins 30. In one embodiment, the first-type semiconductor fins 30 and the second-type semiconductor fins 32 can have the same composition. In another embodiment, the first-type semiconductor fins 30 and the third-type semiconductor fins 34 can have the same composition. In yet another embodiment, the first-type semiconductor fins 30, the second-type semiconductor fins 32, and the third-type semiconductor fins 34 can have the same composition. Each type of semiconductor fins among the first-type semiconductor fins 30, the second-type semiconductor fins 32, and the third-type semiconductor fins 34 can include single crystalline silicon, a single crystalline silicon-germanium alloy, a single crystalline silicon-carbon alloy, or a single crystalline silicon-germanium-carbon alloy.

The first-type semiconductor fins 30 can have a first height h1, the second-type semiconductor fins 32 can have a second height h2, and the third-type semiconductor fins 34 can have a third height h3. The second height h2 and the third height h3 are greater than the first height h1. In one embodiment, the third height h3 can be greater than the second height h2. In another embodiment, the third height h3 can be lesser than the second height h2. Thus, the multiple types of semiconductor fins (30, 32, 34) can have different heights and/or different compositions.

Figure 9:
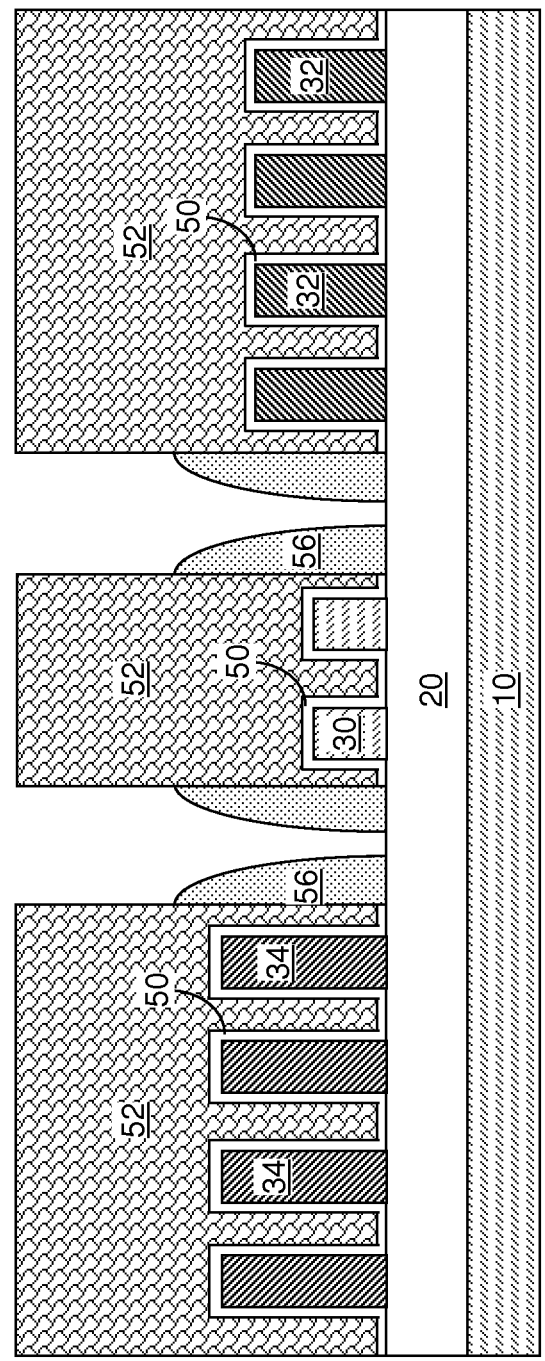
FIG. 9 is a vertical cross-sectional view of the exemplary semiconductor structure after formation of a gate structure according to an embodiment of the present disclosure.
Figure 9A:
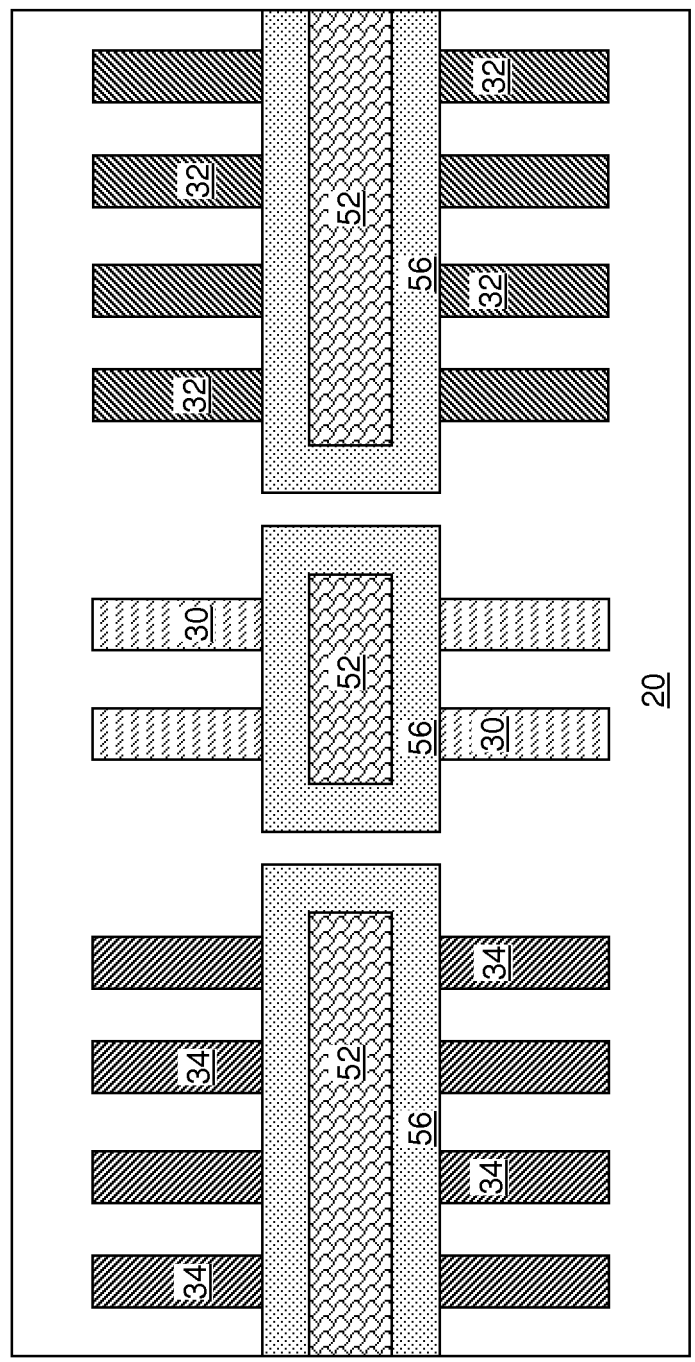
FIG. 9A is a top-down view of the exemplary semiconductor structure of FIG. 9.

Referring to FIGS. 9 and 9A, gate structures (50, 52) straddling one of more of the semiconductor fins (30, 32, 34) can be formed, for example, by deposition of a gate dielectric layer and a conductive material layer, and patterning of the gate dielectric layer and the conductive material layer into gate dielectrics 50 and gate electrodes 52, respectively. At least one gate spacer 56 including a dielectric material can be subsequently formed. Various portions of the semiconductor fins (30, 32, 34) can be suitably doped to form fin field effect transistors.

FIG. 9A is a top-down view of the exemplary semiconductor structure of FIG. 9.

Figure 10:
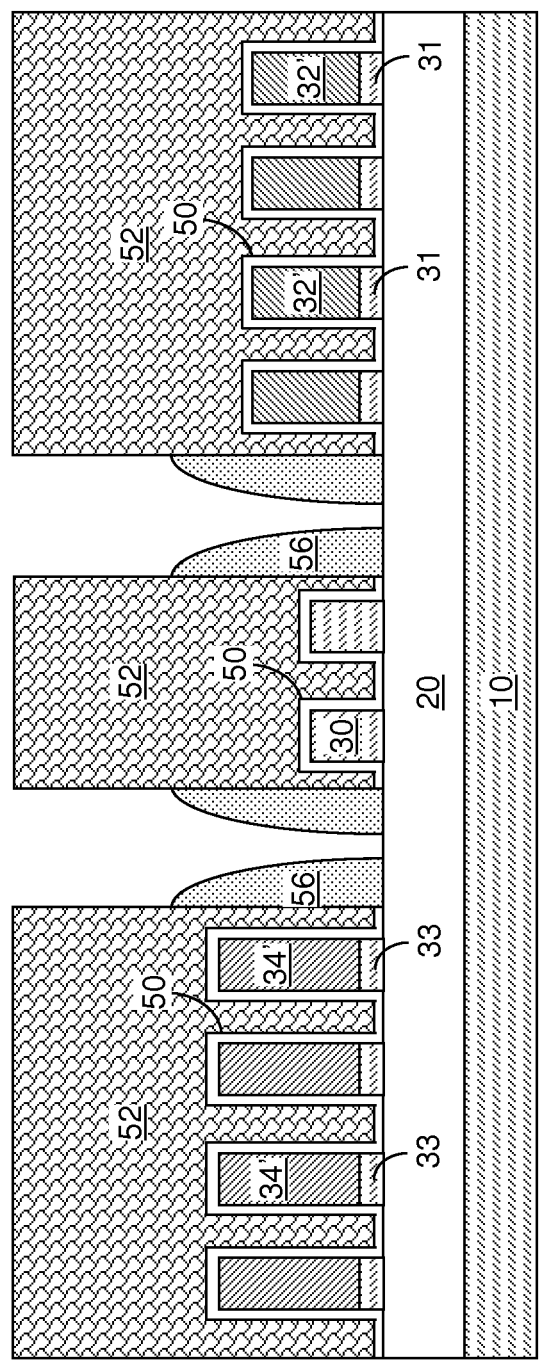
FIG. 10 is a vertical cross-sectional view of a variation of the exemplary semiconductor structure after formation of a gate structure according to an embodiment of the present disclosure.

Referring to FIG. 10, a variation of the exemplary semiconductor structure can be derived from the exemplary semiconductor structure by omitting the processing step of an anneal corresponding to FIG. 6. In this case, the multiple types of semiconductor fins (30, 32', 34') can include first-type semiconductor fins 30 including portions of the first single crystalline semiconductor material, second-type semiconductor fins (32', 31), and third-type semiconductor fins (34', 33). Each second-type semiconductor fin (32', 31) includes a vertical stack, from top to bottom, of a portion of the second single crystalline semiconductor material and a portion of the first single crystalline semiconductor material. The portion of the second single crystalline semiconductor material is herein referred to as a second semiconductor material fin 32' and the portion of the first single crystalline semiconductor material within a second-type semiconductor fin (32', 31). Each third-type semiconductor fin (34', 33) includes a vertical stack, from top to bottom, of portions of the third single-crystalline semiconductor material and a portion of the first single crystalline semiconductor material. The portion of the third single crystalline semiconductor material is herein referred to as a third semiconductor material fin 34' and the portion of the first single crystalline semiconductor material within a third-type semiconductor fin (34', 33).

Each first-type semiconductor fin 30 including the first single crystalline semiconductor material and located on a planar top surface of the insulator layer 20. Each second-type semiconductor fin (32', 31) includes a vertical stack, from bottom to top, of a portion of the first single crystalline semiconductor material and a portion of a second single crystalline semiconductor material that is different from the first single crystalline semiconductor material.

All portions of the first single crystalline semiconductor material among the first-type, second-type, and third-type semiconductor fins (30, 32', 31, 34', 33) can contact the insulator layer 20, have an identical crystallographic structure, and have an identical spatial orientation for each crystallographic axis of the identical crystallographic structure. The identical spatial orientations for each crystallographic axis are due to the epitaxial alignment among the first, second, and third single crystalline semiconductor materials.

In one embodiment, Each third-type semiconductor fin can include a vertical stack, from bottom to top, of another portion of the first single crystalline semiconductor material and a portion of a third single-crystalline semiconductor material that is different from the first single crystalline semiconductor material.

In one embodiment, each of the first-type semiconductor fins 30, the second-type semiconductor fins (32', 31), and the third-type semiconductor fins (34', 33) can have different heights.

In one embodiment, the first single crystalline semiconductor material can be single crystalline silicon, and each of the second and third single crystalline semiconductor materials can be independently selected from a single crystalline silicon-germanium alloy, a single crystalline silicon-carbon alloy, and a single crystalline silicon-germanium-carbon alloy.

The various embodiments of the present disclosure enable independent selection of heights for different types of semiconductor fins. Further, the various embodiments of the present disclosure enable independent selection of each of the first, second, and third single crystalline semiconductor materials. Thus, the on-current and device characteristics can be independently selected for each device type employing one of the three-types of semiconductor fins.

While the present invention is described employing three different types of semiconductor fins, the present invention can be practices with four or more types of semiconductor fins by repeatedly adding dielectric material layers over the first and second dielectric material layers (40, 50; See FIG. 6), forming a trench through the dielectric materials and an upper portion of the semiconductor layer 20 (See FIG. 6), and forming additional single crystalline semiconductor material portions filling such (a) trench(es). Thus, independent selection of fin heights and fin material composition can be performed employing the methods of the present disclosure. In one embodiment, the processing steps of FIGS. 4-6 may be omitted to form only two types of semiconductor fins.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
   forming a first dielectric material layer on a top surface of a semiconductor layer of a semiconductor-on-insulator (SOI) substrate, said semiconductor layer being a first single crystalline semiconductor material portion comprising a first single crystalline semiconductor material;
   forming a first trench through said first dielectric material layer and an upper region of said semiconductor layer;
   growing a second single crystalline semiconductor material portion from surfaces of said semiconductor layer within said first trench in a first selective epitaxy process, wherein said second single crystalline semiconductor material portion comprises a second single crystalline semiconductor material and fills said first trench;
   forming a second dielectric material layer on said top surface of said first dielectric material layer and a top surface of said second single crystalline semiconductor material portion;
   forming a second trench through said second dielectric material layer, said first dielectric material layer, and another upper region of said semiconductor layer; and
   growing a third single crystalline semiconductor material portion from surfaces of said semiconductor layer within said second trench by a second selective epitaxy process, wherein said third single crystalline semiconductor material portion comprises a third single crystalline semiconductor material and fills said second trench.

2. The method of claim 1, further comprising forming semiconductor fins by patterning said first, second, and third single crystalline semiconductor material portions.

3. The method of claim 2, wherein said semiconductor fins comprise:
   first-type semiconductor fins comprising portions of said first single crystalline semiconductor material;
   second-type semiconductor fins comprising portions of said second single crystalline semiconductor material; and
   third-type semiconductor fins comprising portions of said third single-crystalline semiconductor material.

4. The method of claim 3, wherein each of said second-type semiconductor fins further comprises a portion of said first single crystalline semiconductor material, and each of said third-type semiconductor fins further comprises another portion of said first single crystalline semiconductor material.

5. The method of claim 3, wherein said first single crystalline semiconductor material is single crystalline silicon, said second single crystalline semiconductor material is a first single crystalline silicon-containing alloy, and said third single crystalline semiconductor material is a second single crystalline silicon-containing alloy having a different composition from said first single crystalline silicon-containing alloy.

6. The method of claim 5, wherein each of said first single crystalline silicon-containing alloy and said second single crystalline silicon-containing alloy is selected from a single crystalline silicon-germanium alloy, a single crystalline silicon-carbon alloy, and a single crystalline silicon-germanium-carbon alloy.

7. The method of claim 2, further comprising interdiffusing each of said second and third single crystalline semiconductor materials with said first single crystalline semiconductor material by annealing said first, second, and third single crystalline semiconductor material portions prior to forming said semiconductor fins.

8. The method of claim 7, further comprising:
   forming a first single crystalline alloy region including an alloy of said first single crystalline semiconductor material and said second single crystalline semiconductor material through said annealing; and
   forming a second single crystalline alloy region including an alloy of said first single crystalline semiconductor material and said third single crystalline semiconductor material through said annealing.

9. The method of claim 8, wherein said semiconductor fins comprise:
   first-type semiconductor fins comprising portions of said first single crystalline semiconductor material;
   second-type semiconductor fins comprising said alloy of said first single crystalline semiconductor material and said second single crystalline semiconductor material; and
   third-type semiconductor fins comprising said alloy of said first single crystalline semiconductor material and said third single crystalline semiconductor material.

10. The method of claim 8, wherein said second-type semiconductor fins have a homogenous composition throughout, and said third-type semiconductor fins have another homogenous composition throughout.

11. The method of claim 8, wherein said first single crystalline semiconductor material is single crystalline silicon, said alloy of said first single crystalline semiconductor material and said second single crystalline semiconductor material is a first single crystalline silicon-containing alloy, and said alloy of said first single crystalline semiconductor material and said third single crystalline semiconductor material is a second single crystalline silicon-containing alloy having a different composition from said first single crystalline silicon-containing alloy.

12. The method of claim 11, wherein each of said first single crystalline silicon-containing alloy and said second single crystalline silicon-containing alloy is selected from a single crystalline silicon-germanium alloy, a single crystalline silicon-carbon alloy, and a single crystalline silicon-germanium-carbon alloy.

13. The method of claim 2, further comprising removing said first and second dielectric material layer selective to said first, second, and third single crystalline semiconductor material portions prior to said forming of said semiconductor fins.

14. The method of claim 1, wherein a planar top surface of said second single crystalline semiconductor material portion is located above a horizontal plane including a top surface of said first dielectric material layer when said second dielectric material layer is formed.

15. The method of claim 13, wherein a top surface of said third single crystalline semiconductor material portion is formed above another horizontal plane that includes a top surface of said second dielectric material layer.

* * * * *